United States Patent [19]
Bothra

[11] Patent Number: 6,010,939
[45] Date of Patent: Jan. 4, 2000

[54] METHODS FOR MAKING SHALLOW TRENCH CAPACITIVE STRUCTURES

[75] Inventor: Subhas Bothra, San Jose, Calif.

[73] Assignee: VLSI Technology, Inc., San Jose, Calif.

[21] Appl. No.: 09/052,865

[22] Filed: Mar. 31, 1998

[51] Int. Cl.[7] .................................................. H01L 21/20
[52] U.S. Cl. ........................ 438/386; 438/381; 438/800
[58] Field of Search .................................... 438/386, 243, 438/396, 388, 381

[56] References Cited

U.S. PATENT DOCUMENTS

| | | | |
|---|---|---|---|
| 4,812,962 | 3/1989 | Witt | 364/490 |
| 5,389,559 | 2/1995 | Hsieh et al. | 438/243 |
| 5,475,766 | 12/1995 | Tsuchiya et al. | 382/144 |
| 5,553,273 | 9/1996 | Liebmann | 395/500 |

*Primary Examiner*—Charles Bowers
*Assistant Examiner*—Craig Thompson
*Attorney, Agent, or Firm*—Martine Penilla & Kim, LLP

[57] ABSTRACT

Disclosed is a capacitive structure and method for making the capacitive structure for suppressing inductive noise produced by high performance device power supplies. The capacitive structure includes a trench having a bottom surface and respective walls that are integral with the bottom surface. The trench is defined in a semiconductor substrate and is configured to isolate at least one transistor active area from another transistor active area. The structure further includes an oxide layer that is defined along the bottom surface and the respective walls of the trench, such that a channel is defined within the trench between the oxide layer that is defined along the bottom surface and the respective walls. The structure also includes a conductive polysilicon layer that is defined within the channel and is within the trench. The conductive polysilicon layer defines a conductive electrode that is separated from the semiconductor substrate by a thickness of the oxide layer.

8 Claims, 8 Drawing Sheets

| Point | TECH. | $V_{DD}$ | NM | Voltage |
|-------|-------|----------|-----|---------|
| A | 0.5M | 5v | 12% | 0.6v |
| B | 0.35M | 3.3v | 10% | 0.33v |
| C | 0.25M | 2.5v | 8% | 0.2v |
| D | 0.18M | 1.8v | 6% | 0.1v |

6,010,939

METHODS FOR MAKING SHALLOW TRENCH CAPACITIVE STRUCTURES

CROSS REFERENCE TO RELATED APPLICATIONS

This application is related to the following U.S. patent application, entitled "Automated Design of On-chip Capacitive Structures For Suppressing Inductive Noise," having Ser. No. 09/052,908, filed on the same day as the instant application. This application is hereby incorporated by reference.

BACKGROUND OF THE INVENTION

1. Field of the Invention

The present invention relates generally to semiconductor circuits and, more particularly, to capacitive structures for suppressing inductive noise in high performance integrated circuit applications.

2. Description of the Related Art

The continuing trend in modem integrated circuit design is to decrease the physical size of a chip, increase circuit layout density, and increase operating speeds. Although designers have been able to design very high frequency devices that operate at lower power supply voltages, a substantial increase in inductive noise due to a chip's package and printed circuit board (PCB) routing has also occurred. In the past, off-chip discrete capacitor components have been attached directly onto a chip's package or the PCB in order to capacitively shunt the ever increasing inductive noise. Although this was worked with some success in the past, as devices continue to be improved to operate at faster speeds and lower power supply voltages, the allowable noise margin for the inductive noise has also continued to decrease. That is, as devices become faster and faster, a device may fail to operate properly if the inductive noise rises above predetermined allowable noise margins, which necessarily decrease as speeds increase.

FIG. 1A is a simplified diagram of a PCB 100 having a packaged chip integrated onto the PCB 100. In this example, a chip 102 is integrated onto a package 104, which has a plurality of traces 106 that connect the chip 102 to the lead pins of the package 104. As mentioned above, a customary method of suppressing the inductive noise is to attach off-chip discrete capacitor components 108 or 112 on the package 104 or the PCB 100, respectively. Although this has worked in the past, the increased amount of inductive noise produced in devices having clock frequencies above about 200 MHz has been found to be too much for off-chip discrete components to handle. As a result, many high speed devices suffer in having noise margins that exceed the amount recommended for proper high performance operation.

For illustration purposes, FIG. 1B shows a graph 150 that plots allowable noise margins vs. clock frequencies. A plot line 152 illustrates that as clock frequencies increase, the allowable noise margins also decrease. For example, a point A shows that for a 0.5 micron technology device, the allowable noise margin is slightly below about 12% of the voltage source (i.e., Vdd) used. FIG. 1C provides a graph 160 that plots the allowable noise margins as a percentage of the voltage source, where a full rail Vdd is 100%.

Referring back to FIG. 1B, a point B illustrates that the allowable noise margin drops to about 10% of the voltage source used for a 0.35 micron technology device. A point C illustrates that the allowable noise margin drops again to about 8% of the voltage source used for a 0.25 micron technology device, and a point D illustrates that the allowable noise margin drops to about 6% of the voltage source used for a 0.18 micron technology device. FIG. 1C also plots the allowable percentage noise margin for a 0.25 micron technology device.

As can be appreciated, the faster the device gets, the smaller the allowable noise margin becomes, and because lower voltage sources are used for smaller technology devices, the actual voltage magnitude of the allowable noise margin also decreases more substantially. To illustrate this point, reference is drawn to FIG. 1D, where the exemplary micron technologies are compared with respect to the allowable noise margins (NMs), and the resulting voltage magnitudes.

For example, for a 0.5 micron technology device, the voltage source is 5V and the allowable noise margin is about 12%. This therefore produces a noise margin voltage magnitude of about 0.6V. This can then be compared to a 0.18 micron technology device which has a voltage source of 1.8V, and an allowable noise margin of about 6%. The resulting noise margin voltage magnitude will be about 0.1V. Thus, not only does the allowable noise margin decrease as device speed increases, but the voltage supply used in smaller micron technology devices also decreases.

Consequently, that faster and smaller the device, the less it will be able to handle even very small noise margins. Further yet, the faster the device becomes, even more inductive noise tends to be produced. To remedy this, some designers have begun to custom design on-chip capacitors into existing designs. Unfortunately, the design of custom on-chip capacitors has the disadvantage of requiring a substantial amount of chip area, which in some cases may be up to 10% or more additional chip area. Further yet, the design of custom on-chip capacitors also requires time consuming manual examination and modification of the photolithography masks used to design the multi-layered devices.

As can be appreciated, this type of custom design can be very costly, however, this expense has become necessary in order to appropriately suppress the growing levels of inductive noise produced in higher performing devices.

In view of the foregoing, there is a need for techniques that enable fast and efficient design and fabrication of on-chip capacitive structures for suppressing power supply inductive noise without impacting density or enlarging costly chip area

SUMMARY OF THE INVENTION

Broadly speaking, the present invention fills these needs by providing a technique for designing on-chip capacitive structures in shallow trenches used for isolating active devices. The capacitive structures that are defined throughout a semiconductor device are advantageously configured to suppress high levels of inductive noise that is produced in high performance devices. It should be appreciated that the present invention can be implemented in numerous ways, including as a process, an apparatus, a system, a device, or a method. Several inventive embodiments of the present invention are described below.

In one embodiment, a shallow trench capacitive structure is disclosed. The structure includes a trench having a bottom surface and respective walls that are integral with the bottom surface. The trench is defined in a semiconductor substrate and is configured to isolate at least one transistor active area from another transistor active area. The structure further includes an oxide layer that is defined along the bottom surface and the respective walls of the trench, such that a channel is defined within the trench between the oxide layer that is defined along the bottom surface and the respective walls. The structure also includes a conductive polysilicon layer that is defined within the channel and is within the trench. The conductive polysilicon layer defines a conductive electrode that is separated from the semiconductor substrate by a thickness of the oxide layer.

In another embodiment, a method of making a shallow trench capacitor is disclosed. The method includes etching shallow trench regions throughout a semiconductor substrate, and the shallow trench regions are configured to have wall surfaces that are integral with a floor surface. The method includes depositing a partial layer of oxide in the shallow trench regions, such that the partial layer of oxide is formed on the wall surfaces and the floor surface of the shallow trenches, and a channel that is not filled with the partial layer of oxide remains in the shallow trench regions. The method also includes depositing a polysilicon material in the channel that remains in the shallow trench regions. The polysilicon material that is in the channel defines a conductive electrode. The method further includes connecting a power supply between the semiconductor substrate and the conductive electrode, such that the partial layer of oxide defined in the shallow trench regions acts as a capacitor dielectric.

In yet another embodiment, a system for fabricating a trench capacitor for suppressing inductive noise is disclosed. The system includes means for etching shallow trench regions throughout a semiconductor substrate, such that the shallow trench regions have wall surfaces that are integral with a floor surface. The system includes means for depositing a partial layer of oxide in the shallow trench regions, so that the partial layer of oxide is formed on the wall surfaces and the floor surface of the shallow trenches, and a channel that is not filled with the partial layer of oxide remains in the shallow trench regions. The system further includes means for depositing a polysilicon material in the channel that remains in the shallow trench regions, and the polysilicon material that is in the channel defines a conductive electrode. The system also includes connection means for interconnecting a power supply between the semiconductor substrate and the conductive electrode, such that the partial layer of oxide defined in the shallow trench regions acts as a capacitor dielectric.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for a technique used to fabricate on-chip capacitive structures in shallow trenches used for isolating active devices is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
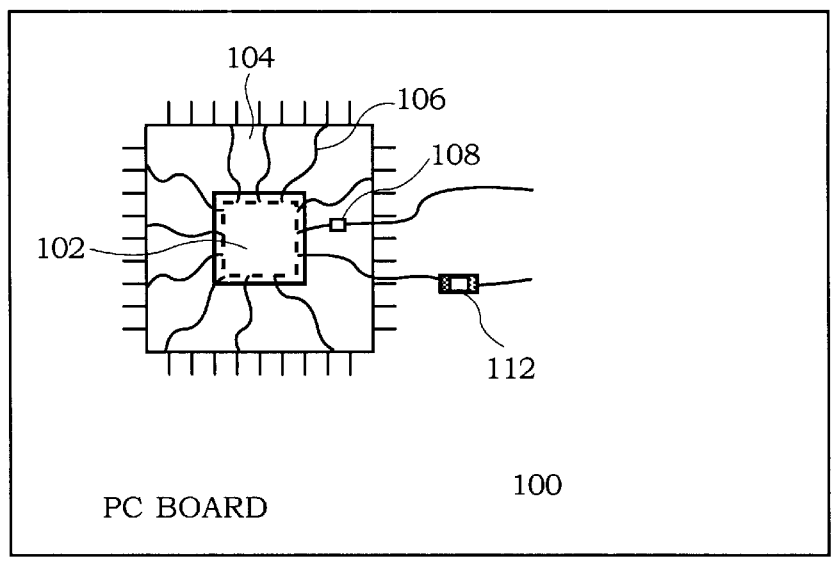
FIG. 1A is a simplified diagram of a PCB having a packaged chip integrated thereon, and discrete capacitor components electrically connected to the packaged chip.
Figure 1B:
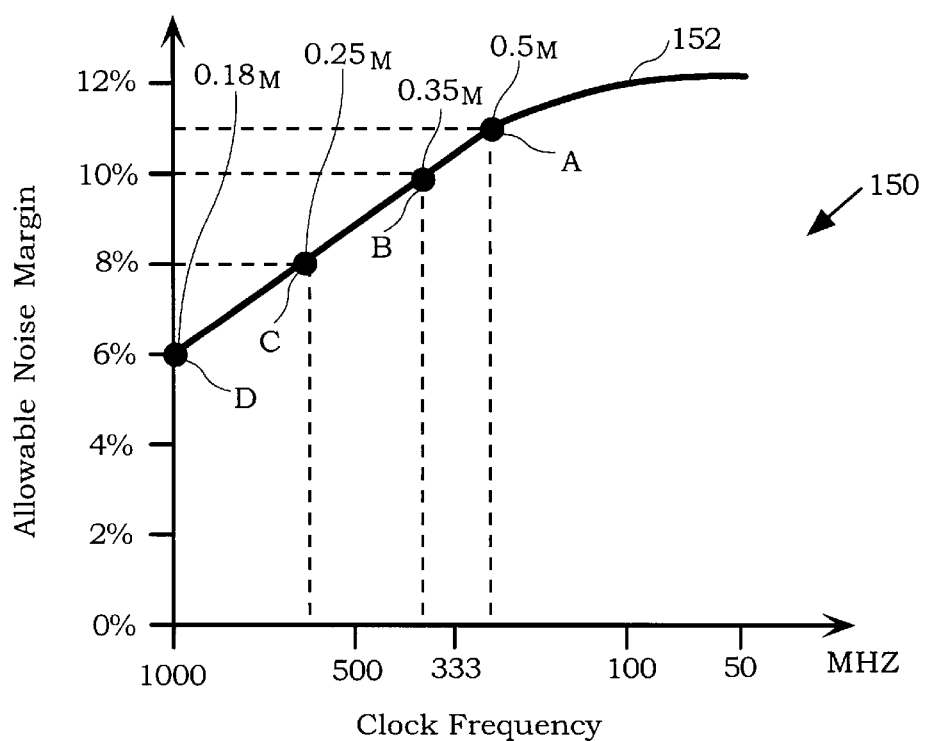
FIG. 1B is a graph that plots allowable noise margins vs. clock frequencies.
Figures 1C, 1D:
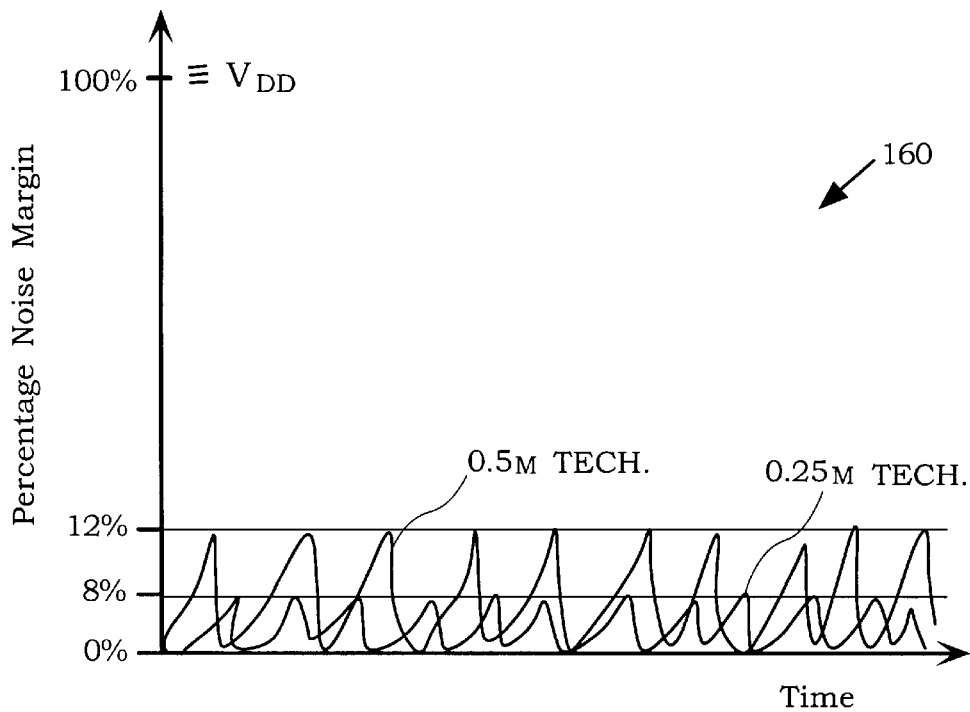
FIG. 1C is a graph that plots percentage noise margin vs. time for comparative micron device technologies.
FIG. 1D is a table that illustrates the difference in allowable noise margins as micron technologies continue to decrease.
Figure 2A:
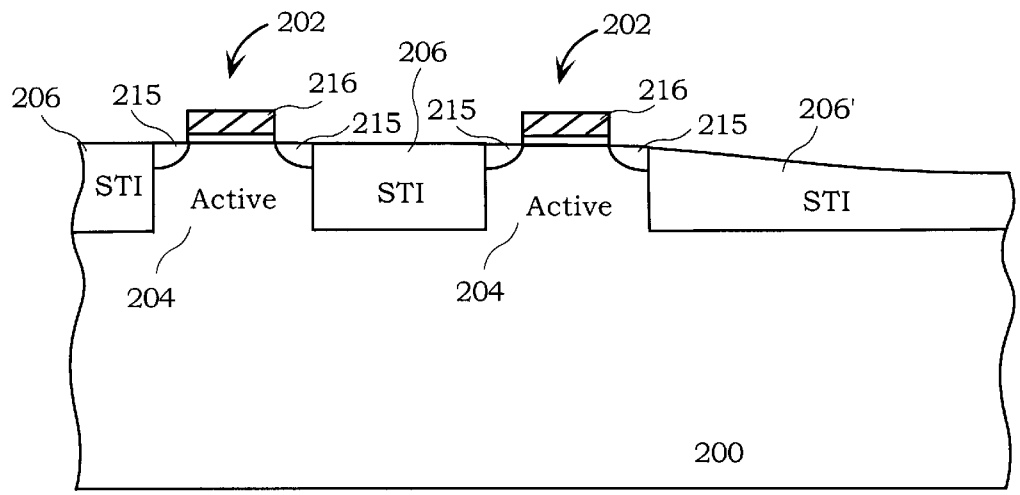
FIGS. 2A–2B show cross-sectional views of semiconductor substrates having active regions for designing transistors in accordance with one embodiment of the present invention.

FIG. 2A shows a cross-sectional view of a semiconductor substrate 200 having active regions 204 for defining transistors 202 in accordance with one embodiment of the present invention. The active regions 204 are preferably isolated from neighboring active regions 204 by oxide filled shallow trench isolation (STI) regions 206. As shown, the active regions 204 have diffusion regions 215 which define the source and drains of the transistors 202, which have polysilicon gates 216 that are defined over respective gate oxides.

In conventional processing, it was discovered that when active regions 204 are separated by long spans from each other, the shallow trench isolation (STI) 206' tends to form a lower topographical profile than do the STI regions 206 that lie between densely arranged transistors 202. In one embodiment of the present invention, dummy active (DA) regions 214 are designed and fabricated throughout the semiconductor substrate 200 (e.g., in unused substrate areas) that are near active regions 204. These dummy active regions 214 assist the oxide in the shallow trench isolation (STI) regions 206 to have a more even topographical profile.

Figure 2B:
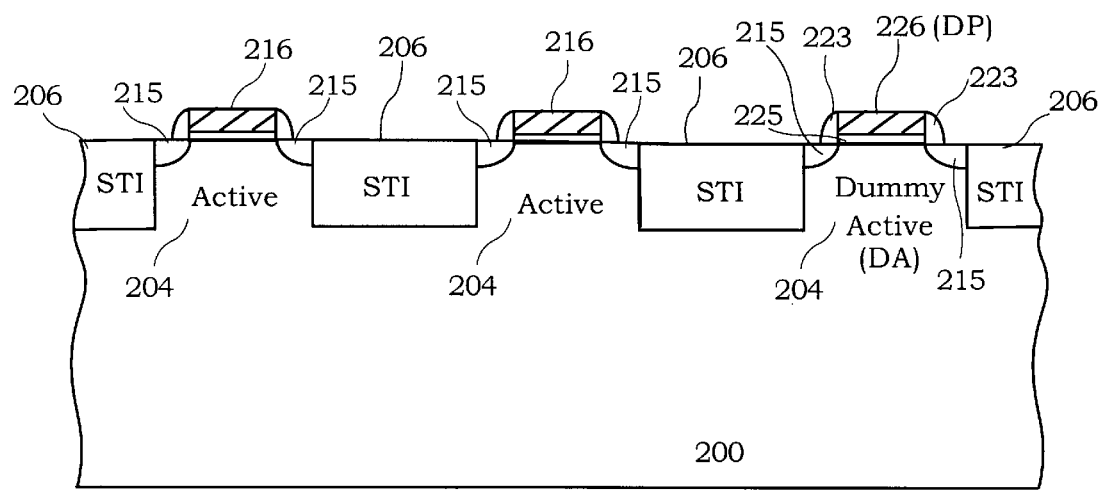

As a result of forming the dummy active regions 214, a more even topographical profile will result throughout substantially all of the semiconductor substrate 200 (and the wafer), which produces a more planar surface that requires less chemical mechanical polishing. In the example of FIG. 2B, the dummy active regions 214 are also shown having diffusion regions 215, a gate oxide 225, spacers 223, and a polysilicon gate 226. In general, the dummy active regions 214 are dispersed throughout the semiconductor substrate 200 in regions where there are no active regions 204.

As described in greater detail in the co-pending U.S. patent application, entitled "Automated Design of On-chip Capacitive Structures For Suppressing Inductive Noise," having Ser. No. 09/052,908 (Attorney Docket No. VT11P186), the dummy active regions 214 and the polysilicon gate 226 lines can be used to make capacitive structures that are coupled between a power supply voltage rail (Vdd) and a ground voltage rail (Vss). These capacitive structures therefore assist in suppressing the inductive noise produced in high speed integrated circuit devices.

Figure 3A:
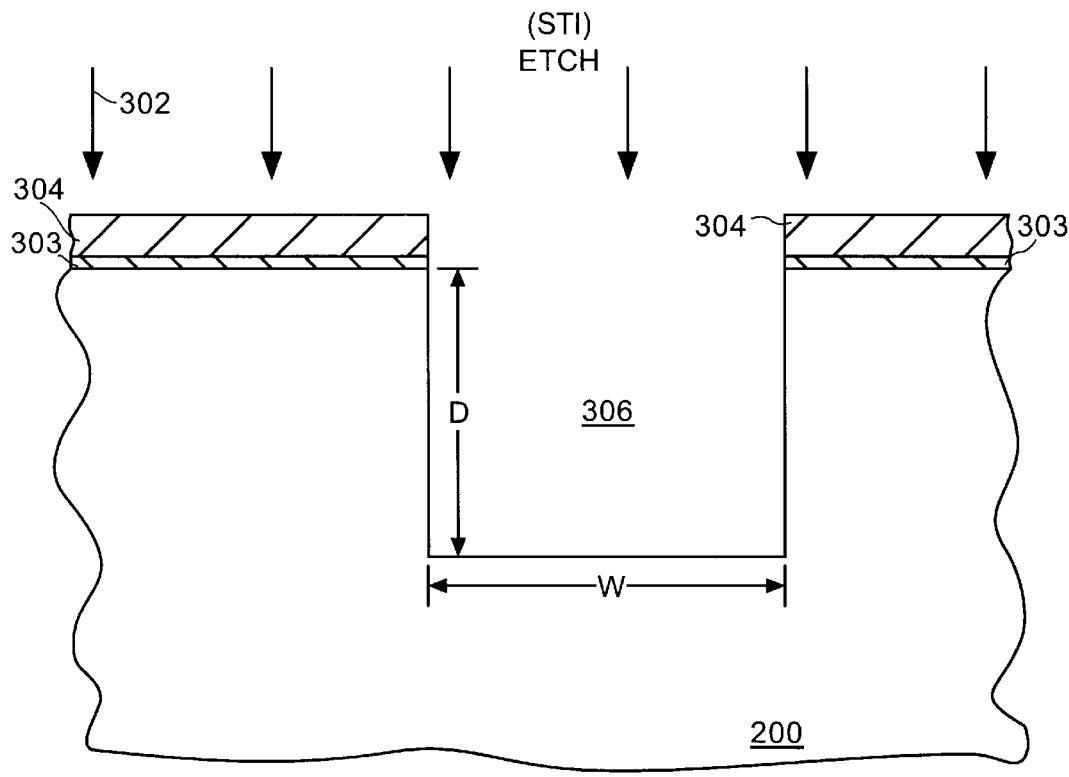
FIGS. 3A–3D show cross-sectional views illustrating the processing operations used to form shallow trench capacitive structures in accordance with one embodiment of the present invention.

FIG. 3A shows a cross-sectional view of the semiconductor substrate 200 after a plasma etch 302 has been performed to create a shallow trench 306 in accordance with one embodiment of the present invention. Initially, the semiconductor substrate 200 is patterned with a silicon nitride mask 304 having a thickness of about 2000 angstroms, which is formed over an oxide layer 303. The shallow trench 306 is preferably etched down to a depth "D" of between about 0.2 microns and about 0.4 microns, and most preferably about 0.3 microns. The width of the shallow trench 306 is preferably between about 0.2 microns and about 0.4 microns, and most preferably about 0.3 microns. Once the shallow trench 306 has been formed, an oxide layer is deposited over the substrate and into the shallow trench 306.

Figure 3B:
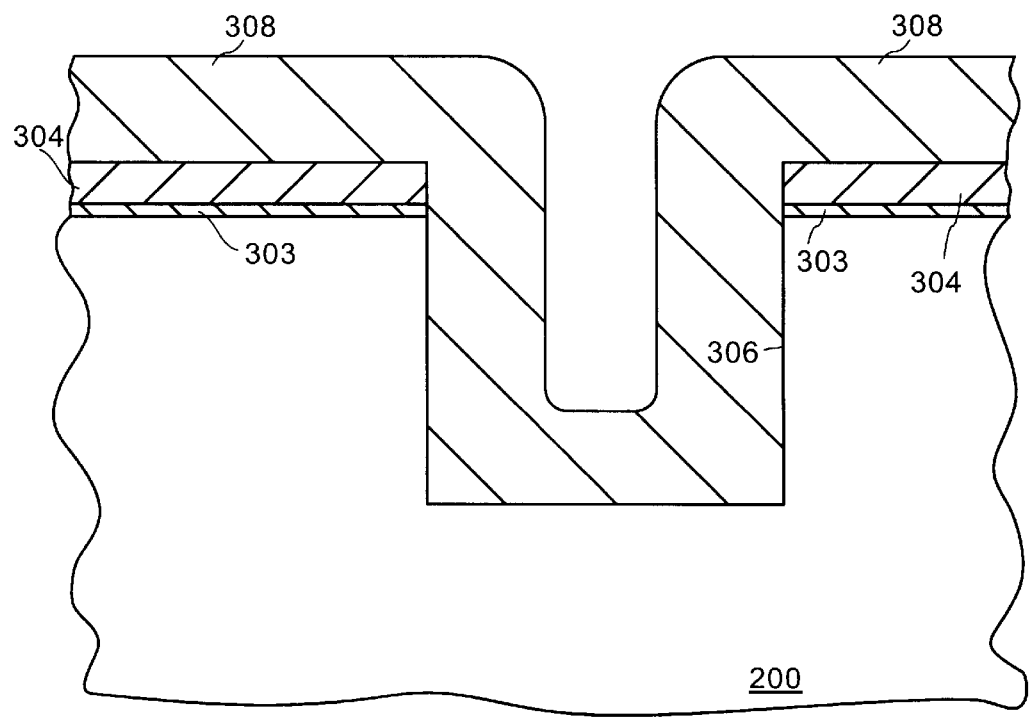

Referring now to FIG. 3B, a chemical vapor deposition (CVD), non-plasma high temperature process is used to deposit a layer of oxide 308. In this embodiment, the non-plasma high temperature process is run at about 750° C., which is well suited to prevent the shallow trench 306 from pinching-off at its top surface and creating a void within the shallow trench 306. In this embodiment, a preferable thickness of between about 200 angstroms and about 1500 angstroms is selected for the oxide layer 308, and more preferably a thickness of about 1000 angstroms is selected.

Figure 3C:
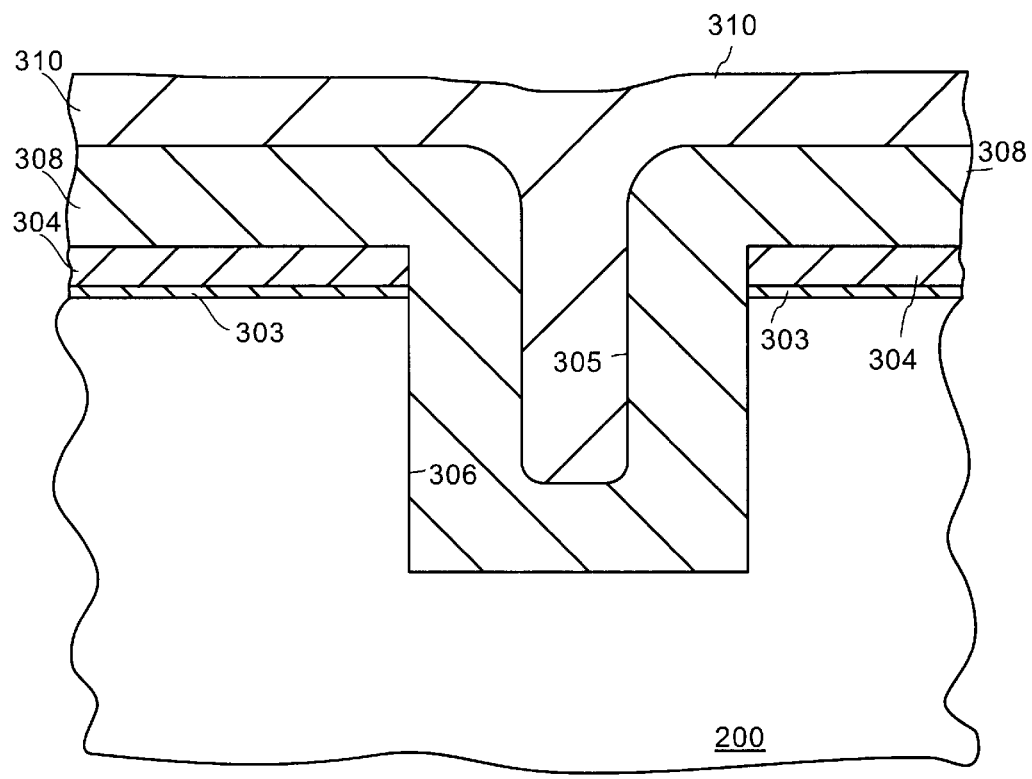

Once the oxide layer 308 has been formed, a polysilicon material is deposited over the oxide layer 308. As shown in FIG. 3C, the polysilicon layer 310 is deposited over the surface of the oxide layer 308 such that a channel 305 is defined within the shallow trench 306 that is substantially filled to the top of the oxide layer 308. In this embodiment, the polysilicon material 310 is preferably deposited to a thickness of between about 500 angstroms and about 5000 angstroms, and most preferably to a thickness of about 2000 angstroms. It is believed that the preferable thickness of 2000 angstroms is well suited to fill the channel 305 that lies within the shallow trench 306, and between the oxide material 308.

Figure 3D:
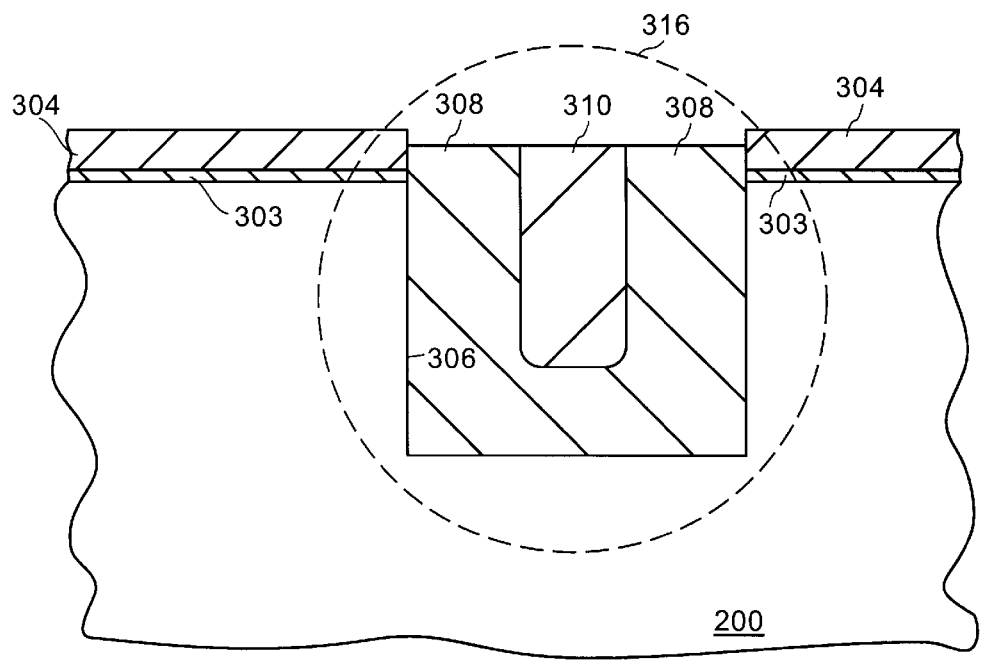

After the polysilicon layer 310 has been deposited, the semiconductor substrate 200 is moved to a chemical mechanical polishing apparatus where the top surface of the polysilicon layer 310, and the oxide layer 308 are removed. In this embodiment, a silica slurry may be used such that the polysilicon layer 310 and the oxide layer 308 will be removed at a much faster rate than the silicon nitride layer 304. One exemplary silica slurry is an "ILD1300" that is available from Rodel Inc. of Newark, Del. As shown in FIG. 3D, the chemical mechanical polishing operation should be performed until the oxide layer 308 and the polysilicon layer 310 are removed just below the silicon nitride layer 304. At this point, a shallow trench isolation capacitive structure 316 will have been formed within the shallow trench 306. Although the above description has be directed toward the formation of a single shallow trench isolation capacitive structure 316, it should be understood that a large plurality of these capacitive structures will actually be fabricated in parallel throughout the individual dies of a given wafer.

As will be described in greater detail below, the capacitive structure 316 is configured to be coupled to the power supply rails (i.e., Vdd/Vss) of a given device, which will enable adequate suppression of inductive noise throughout a high performance semiconductor device. Once the shallow trench isolation capacitive structure 316 is formed, a nitride strip operation is performed using phosphoric acid ($H_3PO_4$). The nitride strip is configured to remove the silicon nitride mask 304, which resides throughout the semiconductor device. Once the silicon nitride mask 304 has been stripped, the shallow trench isolation capacitive structure will be ready to be electrically interconnected using intermetal dielectric layers, conductive vias, and interconnect metallization lines.

In one embodiment, the polysilicon material 310 forms a conductive electrode (i.e., the remaining polysilicon within the trench) that has a thickness of between about 500 angstroms and about 1500 angstroms. Further, the conductive electrode may have a depth of between about 500 angstroms and about 2000 angstroms within the trench. Of course, these exemplary dimensions may vary depending on the micron technology being used.

Figure 4:
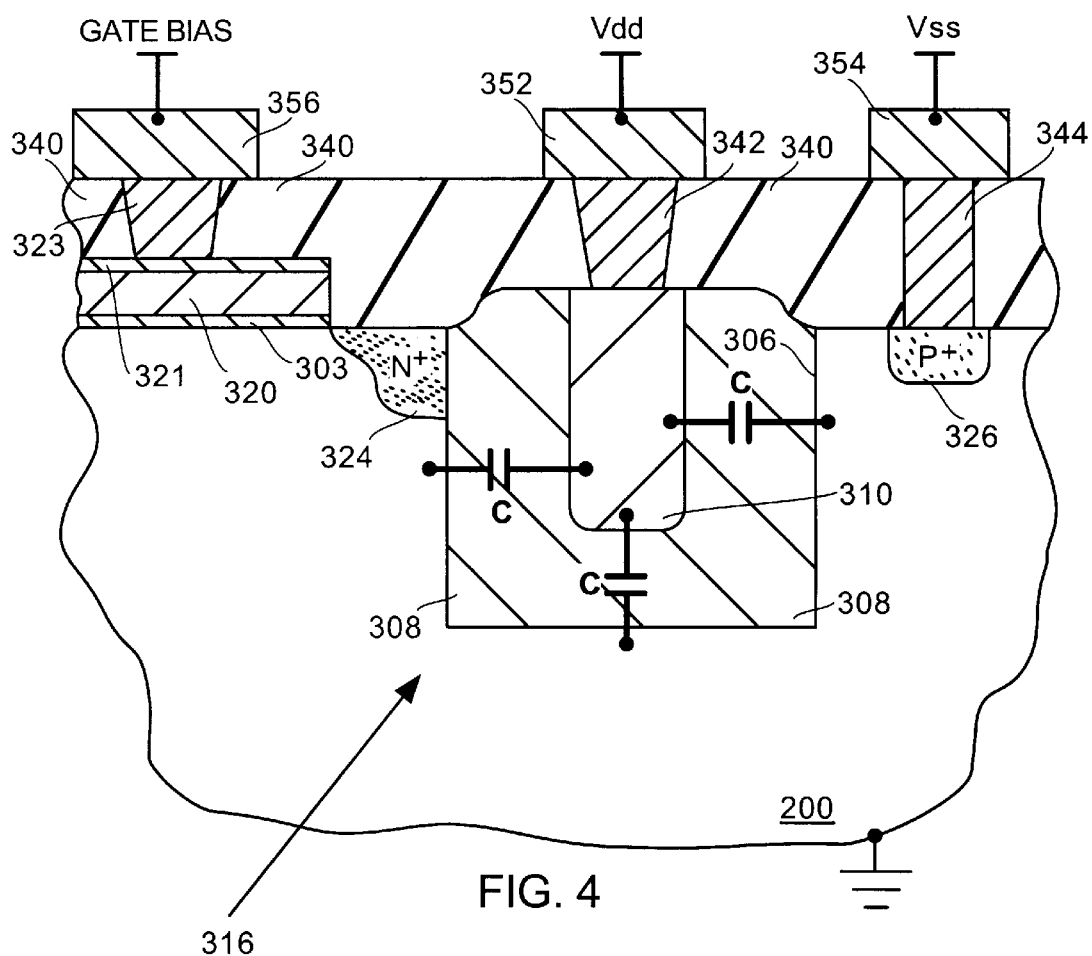
FIG. 4 shows a cross-sectional view of a semiconductor device having a shallow trench isolation capacitive structure interconnected to a power supply in accordance with one embodiment of the present invention.

FIG. 4 shows a cross-sectional view of a semiconductor device having a shallow trench isolation capacitive structure 316 interconnected to a power supply in accordance with one embodiment of the present invention. In this example, a polysilicon gate 320 is shown formed over a gate oxide 303. The polysilicon gate 320 has a silicided layer 321 (for reducing sheet resistance), which is in contact with a conductive via 323 that is formed through an oxide layer 340. The conductive via 323 is thus connected to a metallization line 356.

The metallization line 356 may then be connected to an appropriate gate bias voltage, which may be routed throughout the semiconductor device. The transistor having the gate 320 also includes N+diffusion regions 324, which may be either the source or the drain of that device. As shown, the transistor device is well isolated from other semiconductor devices through the use of the oxide layer 308, which is defined within the shallow trench 306.

Accordingly, it should be appreciated that the shallow trench isolation capacitive structure 316 not only serves as a power supply inductive noise suppressing structure, but also fulfills its isolation function between neighboring active transistor devices.

In cases where the semiconductor substrate 200 is coupled to ground, the polysilicon material 310 that is contained within the shallow trench 306 is interconnected through a conductive via 342, which is defined through the oxide layer 340 to a metallization line 352. The metallization line 352 may then be routed and interconnected to an appropriate power supply line (Vdd).

In a like manner, the semiconductor substrate 200 may be coupled to the ground rail (Vss) through a conductive via 344, which is formed through the oxide layer 340. The conductive via 344 interconnects a P+substrate contact 326 and a metallization line 354. The metallization line 354 may then be interconnected to the ground rail Vss. Once the power supply rail Vdd and the ground rail Vss are interconnected, the capacitive structure 316 is established between the polysilicon material 310 and the substrate 200. That is, the substrate 200 and the polysilicon material 310 will function as the capacitive plates, and the oxide material 308 will function as a dielectric material of the capacitive structure 316.

As mentioned above, although only one shallow trench isolation capacitive structure 316 is shown, it should be understood that a network of capacitive structures will actually exist throughout the semiconductor device, which would typically isolate a plurality of active regions or dummy active devices.

Figure 5B:
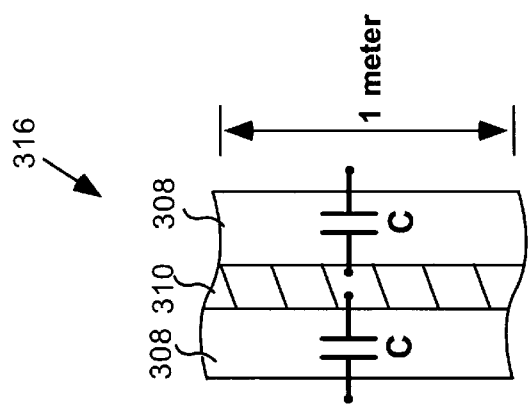
FIG. 5B shows a more detailed top view of a shallow trench isolation capacitive structure which is formed around typical active regions and dummy active regions in accordance with one embodiment of the present invention.
Figure 5A:
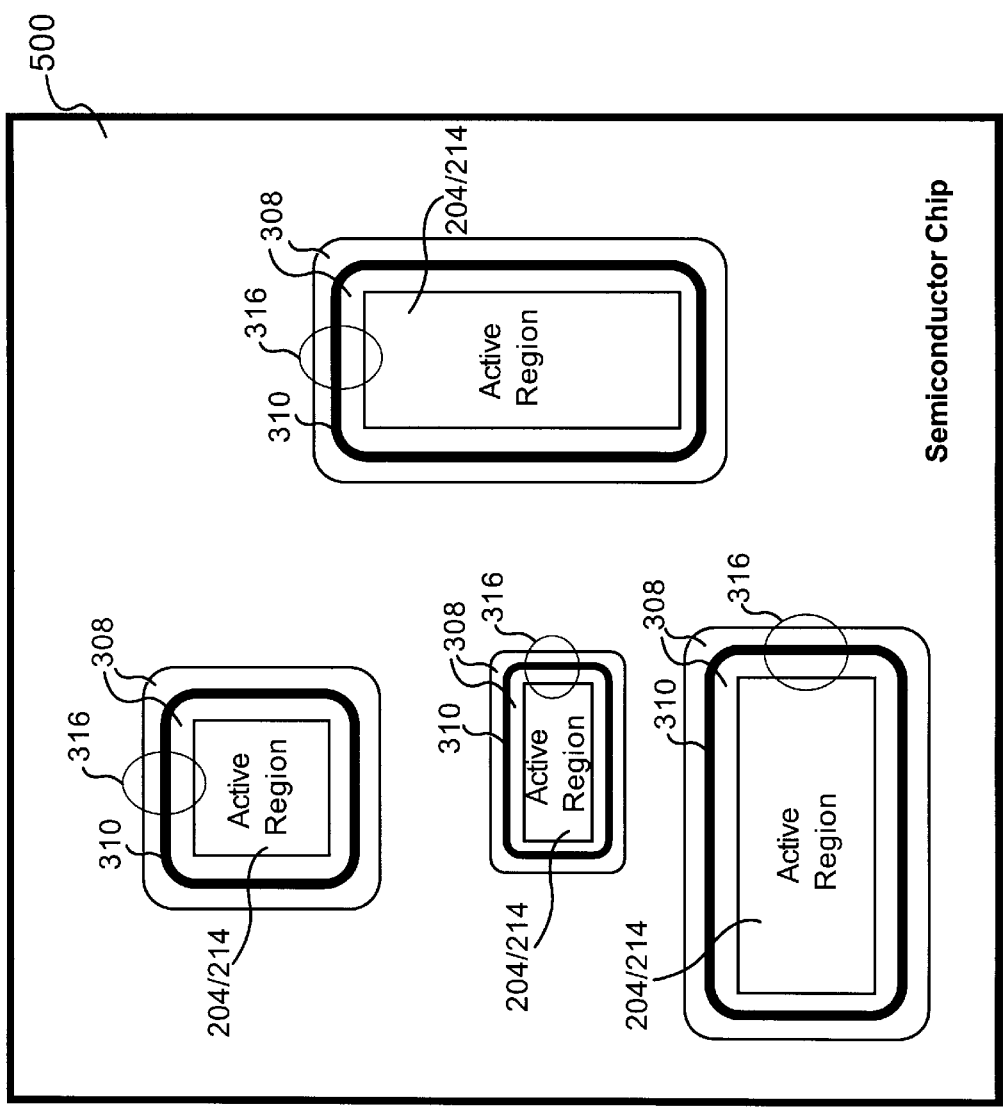
FIG. 5A shows a simplified top view of a semiconductor chip having a network of capacitive structures in accordance with one embodiment of the present invention.

FIG. 5A shows a simplified top view of a semiconductor chip 500 having a network of capacitive structures in accordance with one embodiment of the present invention. Although typical semiconductor devices have thousands of active regions 204/214, only four representative active regions are shown to illustrate how a very large network of shallow trench isolation capacitive structures 316 may be formed throughout a semiconductor chip.

As mentioned above, the capacitive structures are typically interconnected to a power supply to effectively suppress power supply inductive noise throughout a given device. In typical semiconductor devices, it is possible to have many meters of shallow trenches. In some applications, typical shallow trench isolation lengths range between about 10 meters and about 250 meters, and in other applications the shallow trench isolation lengths may range between about 10 meters and about 100 meters. Accordingly, when the shallow trench isolation capacitive structures 316 are formed within the shallow trench isolation regions, it is possible to construct very large capacitive structures, without having to increase semiconductor die space or impact density.

In typical structures such as those described above, about 30 pico farads (pf) of capacitance may be achieved for each meter length of the shallow trench isolation capacitive structure. Accordingly, a total capacitance ranging between about 300 pico farads and about 3,000 pico farads may be achieved for distances of between about 10 meters and 100 meters. The ability to construct this network of capacitive structures directly into the shallow trench isolation regions therefore provides a large enough capacitance to suppress inductive noise levels that range between 0.1 nH and 1 nH (or greater), without increasing die size or implementing costly off-chip discrete capacitor components.

FIG. 5B shows a more detailed top view of the shallow trench isolation capacitive structure which is formed around typical active regions and dummy active regions in accordance with one embodiment of the present invention. As shown, the polysilicon material 310 is formed within the shallow trench region 306 and the oxide material 308 sandwiches the polysilicon material 310. As mentioned above, a one meter length of the shallow trench isolation capacitive structure is capable of producing about 30 pico farads of capacitance. This capacitance is of course, coupled to the power supply in order to suppress the ever growing inductive noise that is produced in high performance devices.

Figure 6:
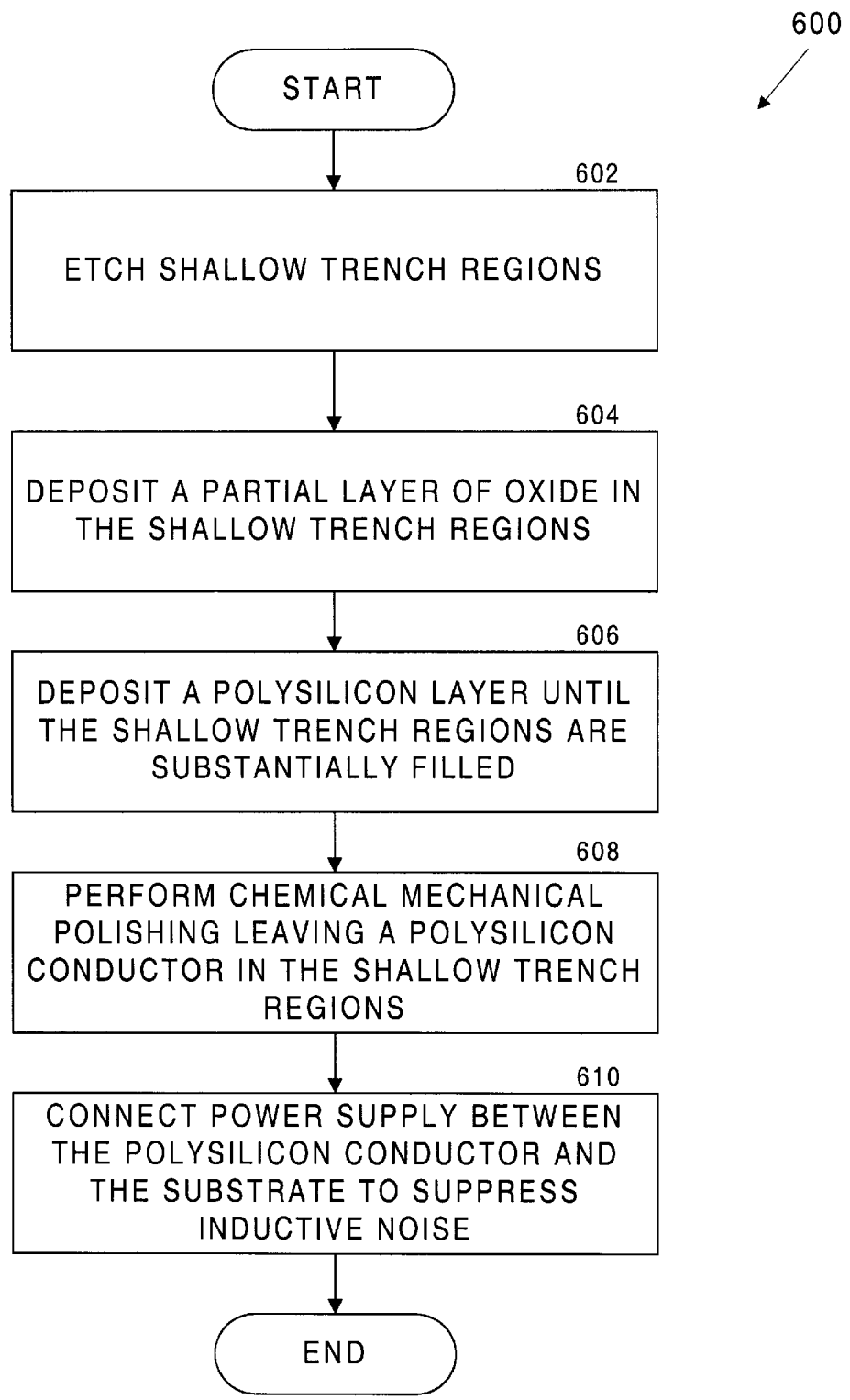
FIG. 6 shows a flowchart diagram illustrating the method operations used for forming a shallow trench isolation capacitive structure in accordance with one embodiment of the present invention.

FIG. 6 shows a flowchart diagram 600 illustrating the method operations used for forming a shallow trench isolation capacitive structure in accordance with one embodiment of the present invention. The method begins at an operation 602 where shallow trench regions are etched throughout a semiconductor device to isolate selected active regions (and possibly dummy active regions). Once the shallow trench regions have been defined, the method proceeds to an operation 604. In operation 604, a partial layer of oxide is deposited in the shallow trench regions.

As discussed above, the oxide layer is preferably deposited using a non-plasma high temperature chemical vapor deposition (CVD) operation which leaves a channel within the shallow trench regions. Once the partial layer of oxide has been deposited, the method proceeds to an operation 606 where a polysilicon layer is deposited over the semiconductor device until the channels in the shallow trench regions are substantially filled. At this point, the shallow trench regions are partially filled with an oxide layer and a center conductive region is filled with a polysilicon material. Once the polysilicon layer has been deposited, the method proceeds to an operation 608.

In operation 608, a chemical mechanical polishing operation is performed leaving a polysilicon conductor in the shallow trench regions. At this point, a network of shallow trench isolation capacitive structures have been formed throughout a semiconductor device. Once the chemical mechanical polishing operation has been performed, the method will proceed to an operation 610.

In operation 610, further semiconductor processing is performed in order to interconnect the polysilicon conductor and the substrate to appropriate power supply rails in order to suppress power supply inductive noise. Once the power supply has been interconnected to the shallow trench isolation capacitive structures, the method will end.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of making a shallow trench capacitor, comprising:

etching shallow trench regions throughout a semiconductor substrate, the shallow trench regions having wall surfaces that are integral with a floor surface;

depositing a partial layer of oxide in the shallow trench regions, such that the partial layer of oxide is formed on the wall surfaces and the floor surface of the shallow trenches, and a channel that is not filled with the partial layer of oxide remains in the shallow trench regions;

depositing a polysilicon material in the channel that remains in the shallow trench regions, the polysilicon material that is in the channel defines a conductive electrode; and connecting a power supply between the semiconductor substrate and the conductive electrode, such that the partial layer of oxide defined in the shallow trench regions acts as a capacitor dielectric.

2. A method of making a shallow trench capacitor as recited in claim 1, further comprising:

performing a chemical mechanical polishing operation in order to remove a layer of the polysilicon material and the partial layer of oxide that is not substantially within the shallow trench regions.

3. A method of making a shallow trench capacitor as recited in claim 2, wherein the chemical mechanical polishing operation implements a silica slurry material.

4. A method of making a shallow trench capacitor as recited in claim 1, wherein the connecting the power supply between the semiconductor substrate and the conductive electrode further includes:

connecting a power rail (Vdd) to the conductive electrode; and connecting a ground rail (Vss) to the semiconductor substrate.

5. A method of making a shallow trench capacitor as recited in claim 1, wherein the connecting the power supply between the semiconductor substrate and the conductive electrode further includes:

connecting a power rail (Vdd) to the semiconductor substrate; and connecting a ground rail (Vss) to the conductive electrode.

6. A method of making a shallow trench capacitor as recited in claim 1, wherein the depositing of the partial layer of oxide in the shallow trench regions includes:

implementing a non-plasma high temperature chemical vapor deposition process to deposit a layer of between about 200 angstroms and about 1500 angstroms.

7. A method of making a shallow trench capacitor as recited in claim 6, wherein the a non-plasma high temperature chemical vapor deposition process is run at a temperature of about 750 degrees Celsius.

8. A method of making a shallow trench capacitor as recited in claim 1, wherein the etching shallow trench regions throughout the semiconductor substrate includes:

defining a depth of between about 2000 angstroms and about 4000 angstroms in the shallow trench regions.

* * * * *